United States Patent
Park et al.

(10) Patent No.: US 10,844,244 B2
(45) Date of Patent: Nov. 24, 2020

(54) POLISHING ADDITIVE COMPOSITION, POLISHING SLURRY COMPOSITION AND METHOD FOR POLISHING INSULATING FILM OF SEMICONDUCTOR ELEMENT

(71) Applicant: SOULBRAIN CO., LTD., Seongnam-si (KR)

(72) Inventors: Jong Ho Park, Seongnam-si (KR); Myeong Hoon Han, Seongnam-si (KR)

( * ) Notice: Subject to any disclaimer, the term of this patent is extended or adjusted under 35 U.S.C. 154(b) by 0 days.

(21) Appl. No.: 16/228,794

(22) Filed: Dec. 21, 2018

(65) Prior Publication Data

US 2020/0172763 A1   Jun. 4, 2020

(30) Foreign Application Priority Data

Dec. 3, 2018   (KR) .......................... 10-2018-0153833

(51) Int. Cl.
| | | |
|---|---|---|
| *C09G 1/04* | (2006.01) | |
| *H01L 21/3105* | (2006.01) | |
| *H01L 21/321* | (2006.01) | |
| *H01L 21/306* | (2006.01) | |
| *C09G 1/02* | (2006.01) | |

(52) U.S. Cl.
CPC .................. *C09G 1/04* (2013.01); *C09G 1/02* (2013.01); *H01L 21/30625* (2013.01); *H01L 21/31053* (2013.01); *H01L 21/3212* (2013.01)

(58) Field of Classification Search
CPC ....... C09G 1/04; C09G 1/02; H01L 21/30625; H01L 21/3212; H01L 21/31053
See application file for complete search history.

(56) References Cited

U.S. PATENT DOCUMENTS

| | | | |
|---|---|---|---|
| 2010/0081281 A1* | 4/2010 | Babu | .......................... C09G 1/02 438/693 |
| 2019/0085208 A1* | 3/2019 | Shinoda | ................ C07D 257/06 |
| 2019/0284434 A1* | 9/2019 | Brosnan | ............. H01L 21/31053 |

FOREIGN PATENT DOCUMENTS

| | | |
|---|---|---|
| KR | 101406757 B1 | 6/2014 |
| KR | 101470979 B1 | 12/2014 |

* cited by examiner

*Primary Examiner* — Duy Vu N Deo
(74) *Attorney, Agent, or Firm* — Jongkook Park

(57) ABSTRACT

The present invention relates to a method for polishing an insulating film of a semiconductor element, comprising polishing an insulating film, which is formed by embedding a conductive pattern formed on a substrate, with a polishing slurry composition comprising a polishing agent including polishing particles; and a polishing additive composition comprising a dialkyldiallylammonium halide, a basic amino acid, a non-ionic surfactant, and a pH adjuster, thereby removing a step involved in the insulating film.

15 Claims, No Drawings

POLISHING ADDITIVE COMPOSITION, POLISHING SLURRY COMPOSITION AND METHOD FOR POLISHING INSULATING FILM OF SEMICONDUCTOR ELEMENT

CROSS-REFERENCE TO RELATED APPLICATIONS

This application claims priority under 35 U.S.C. § 119 to Korean Patent Application No. 10-2018-0153833, filed on Dec. 3, 2018, in the Korean Intellectual Property Office, the disclosure of which is incorporated herein by reference in its entirety.

TECHNICAL FIELD

The following disclosure relates to a polishing slurry composition capable of reducing the polishing loss of a concave portion of an insulating film of a semiconductor element and improving the polishing rate, and a method for polishing an insulating film of a semiconductor element.

BACKGROUND

Among the process for manufacturing a semiconductor device, the chemical mechanical polishing (CMP) process is one of the planarization techniques used for removing a step in an insulating film formed on a substrate. In the CMP process, the polishing process is implemented by placing the wafer to be subjected to a planarization process on a platen, contacting a surface of the wafer with the polishing pad of a polisher, and then rotating the rotating plate and the pad of the polisher while supplying a slurry. In other words, the slurry flows between the wafer surface and the pad, such that polishing of the wafer surface is performed by mechanical friction caused by polishing particles in the slurry and surface protrusions of the pad, while chemical removal is simultaneously achieved through chemical reaction between the chemical components in the slurry and the wafer surface.

As the degree of planarization of a substrate for manufacturing a semiconductor element in a semiconductor manufacturing process becomes better and better, the margin of subsequent processes becomes wider, which is very advantageous in view of the yield of semiconductor products that are obtained. As a technique for further improving the degree of planarization of the substrate in a chemical mechanical polishing process, techniques for improving the chemical mechanical polishing apparatus or the polishing method have been reported. However, the improvement of the polishing apparatus or the polishing method may achieve improvement of the degree of planarization of the substrate to some extent, but the degree of improvement is not great, and thus a more fundamental solution is required.

Accordingly, techniques for improving the degree of planarization by improving the slurry used in the chemical mechanical polishing process have also been reported. Korean Patent No. 1406757 discloses a technique for using a slurry composition dispersed to have a positive charge so that high step regions have a high polishing rate and low step regions have a polishing protective film formed thereon, thereby resulting in suppression of polishing. However, although the dispersion stability and flat plate polishing amount are excellent, this document fails to consider the polishing loss of a concave portion at all. In addition, in Korean Patent No. 1470979, the polishing selectivity of an oxide film to a nitride film is controlled by using a slurry composition containing colloidal cerium oxide. However, there is a problem in that an automatic polishing stop (auto stop) function is not provided.

In conclusion, in the technique of performing planarization by polishing a pattern having a high step, it is important to polish only the convex portion of the pattern and to reduce the polishing loss with respect to the concave portion. Further, in order to achieve a high degree of planarization in the course of increasingly miniaturizing and integrating semiconductor processes, it is also important to provide an automatic polishing stop function so as to prevent further polishing at the time at which planarization is achieved.

Patent Literature 1: KR101406757
Patent Literature 2: KR101470979

SUMMARY

To solve the above-mentioned problems, in the process of manufacturing a semiconductor, in a technique for planarization implemented by polishing patterns with a high step, the present invention is directed to providing a polishing slurry composition capable of polishing only the convex portions of patterns and reducing the polishing loss with respect to concave portions. In addition, when the polishing slurry composition of the present invention is used, it is attempted to provide an automatic polishing stop (auto stop) function so as to prevent further polishing at a specific planarization timepoint.

To solve the above-mentioned problems, an embodiment of the present invention provides a polishing slurry composition comprising a dialkyldiallylammonium halide, a basic amino acid, a non-ionic surfactant, and a pH adjuster.

Another embodiment of the present invention provides a polishing slurry composition comprising a polishing agent including polishing particles; and the polishing additive composition.

Further, the present invention provides a method for polishing an insulating film of a semiconductor element, comprising polishing an insulating film, which is formed by embedding a conductive pattern formed on a substrate, with the polishing slurry composition, thereby removing the step involved in the insulating film.

DETAILED DESCRIPTION OF EMBODIMENTS

The present invention provides a polishing additive composition comprising a dialkyldiallylammonium halide, a basic amino acid, a non-ionic surfactant, and a pH adjuster.

The dialkyldiallylammonium halide is an additive which is added to minimize the polishing loss of a concave portion (silicon nitride film), and may be adsorbed on a surface of a concave portion, which is a hydrophilic insulating film. Through such adsorption on the concave portion during a polishing process, the dialkyldiallylammonium halide may serve to prevent contact between the polishing pad and the concave portion, thereby resulting in suppression of polishing loss of the concave portion.

The alkyl of the dialkyldiallylammonium halide may comprise a linear or branched alkyl group having 1 to 10 carbon atoms. The alkyl group may be a methyl group, an ethyl group, a propyl group, an isopropyl group, a butyl group, a tert-butyl group, a pentyl group, an isopentyl group, a neopentyl group, a hexyl group, a heptyl group, an octyl group, a nonyl group, a decanyl group, or the like, but the alkyl group is not limited thereto.

The dialkyldiallylammonium halide may comprise at least one selected from a group consisting of dimethyldiallylammonium halide, diethyldiallylammonium halide, dipropyldiallylammonium halide, dibutyldiallylammonium halide, and diisopropyldiallylammonium halide.

Specifically, the dialkyldiallylammonium halide may comprise diallyldimethylammonium halide.

The dialkyldiallylammonium halide may be included in the polishing additive composition in an amount of 0.01 to 2 parts by weight. More specifically, the dialkyldiallylammonium halide may be included in an amount of 0.1 to 0.3 parts by weight. When the amount of the dialkyldiallylammonium halide is less than 0.01 parts by weight, the polishing-prevention function of the concave portion is insignificant, and thus it is difficult to suppress the polishing loss of the concave portion. When the amount thereof exceeds 2 parts by weight, the overall polishing rate may be lowered.

The basic amino acid serves to suppress polishing of the concave portion. In particular, an anionic group derived from a carboxyl group of the basic amino acid binds to a surface of the concave portion (nitride film), and thus a cationic group derived from an amine group is directed outward, and lysine, for example, bonded with the concave portion may prevent a polishing agent from contacting with the concave portion, thereby resulting in suppression of polishing.

The basic amino acid may be included in the polishing additive composition in an amount of 0.01 to 2 parts by weight, and preferably 0.05 to 1 part by weight. When the amount of the basic amino acid is less than 0.01 parts by weight, the polishing efficiency of the convex portion may fall, and the ability to suppress the polishing loss of the concave portion may be lowered. When the amount exceeds 2 parts by weight, the polishing rate may be reduced during the polishing process.

The non-ionic surfactant is added for controlling the viscosity of the polishing additive composition of the present invention as well as the flow of the slurry, and has a passivation function for preventing polishing of the concave portion.

The non-ionic surfactant may comprise at least one selected from a group consisting of polyethylene glycol, polypropylene glycol and polyvinyl alcohol.

The non-ionic surfactant may be included in an amount of 0.01 to 2 parts by weight. When the amount of the non-ionic surfactant is less than 0.01 parts by weight, scratches may occur during the polishing process. When the content of the nonionic surfactant exceeds 2 parts by weight, the amount of bubbles occurring during the polishing process increases, and the overall polishing rate may be lowered.

The pH adjuster may be added for the purpose of allowing the polishing slurry composition of the present invention to have an automatic polishing stop (auto stop) function. In order to adjust the pH of the polishing slurry composition as described above, the pH adjuster may comprise at least one selected from the group consisting of sulfuric acid, hydrochloric acid, nitric acid, phosphoric acid, acetic acid, citric acid, sodium hydroxide, potassium hydroxide, ammonium hydroxide, sodium hydrogen carbonate, sodium carbonate, trialkylamine, trialkanolamine, and a quaternary organic ammonium salt.

The pH adjuster may be added to adjust the pH of the polishing slurry composition to a range of pH 1 to 7, and specifically, to the range of pH 1 to 5, wherein the pH of the polishing additive composition may be 3 to 7, and specifically, in the range of pH 5 to 7.

When the pH of the polishing slurry composition satisfies the above-described range, dispersion stability of the polishing agent can be improved. When the pH of the polishing slurry composition is outside of the above-described range, the dispersion stability may be broken, and thus the polishing rate of the convex portion may be reduced, thereby causing a problem in that it is difficult to secure a sufficient polishing amount.

The polishing additive composition may further comprise a residual solvent, wherein the solvent may be any solvent as long as it is one used in a slurry composition for a chemical mechanical polishing process. For example, the solvent may be deionized water, but the solvent is not limited thereto.

Further, the present invention provides a polishing slurry composition comprising a polishing agent including polishing particles; and the polishing additive composition.

The surface of the polishing particles may be positively charged (+). In other words, before addition of the polishing slurry composition, the zeta potential of the surface of the polishing particles may be +30 mV to +60 mV, and preferably +35 mV to +45 mV. Since the zeta potential of the polishing particles has a positive value, the polarity of the surface of the convex portion (silicon oxide film) is negative, and thus the polishing efficiency is increased by an attractive force between the polishing particles and the surface of the convex portion (silicon oxide film), thereby resulting in suppression of the occurrence of a loading effect in which the initial polishing rate is slow in patterns having a step.

The polishing particles may have a zeta potential of +45 mV to +50 mV on the surface after being mixed with the polishing slurry composition.

The polishing particles may be particles comprising a metal oxide. For example, the polishing particles may comprise at least one metal oxide selected from the group consisting of zirconia, alumina, silica, and ceria, but the particles are not limited thereto.

The polishing particles may be particles produced by a liquid phase method such as a sol-gel method, a coprecipitation method, a hydrothermal synthesis method, or the like. When polishing particles produced by the liquid phase method are employed, due to the near-spherical shape of the particles in the polishing slurry composition, the occurrence of micro-scratches during the polishing process may be reduced and the polishing rate may be uniformly set.

The polishing particles may be cerium oxide. Cerium oxide has a very high polishing rate on surfaces containing silicon, such as a glass or a semiconductor substrate (Si wafer), by a chemical polishing mechanism in which Si—O—Ce bonds are formed between the Si and Ce atoms, and it has a low particle hardness, thus it is preferable that cerium oxide is included as a polishing particle.

The polishing particles may be included in an amount of 0.1 to 5% by weight in the polishing agent. When the amount of the polishing particles is less than 0.1% by weight, the polishing rate tends to decrease. When the amount of the polishing particles exceeds 5% by weight, it is easy for scratches to occur on a film to be polished, polishing grooves tend to occur, and the auto stop function may be lowered.

Regarding the particle size of the polishing particles, in consideration of the scratches and the polishing rate, the primary particle size (measured by BET surface area) may be 10 nm to 80 nm, and the secondary particle size may be 80 nm to 200 nm. When the primary particle size of the polishing particles is less than 10 nm, the cleaning property and the polishing rate may be lowered, thus resulting in deterioration of the polishing efficiency with respect to the convex portion. When the primary particle size thereof exceeds 80 nm, dispersion stability may be impaired, thus resulting in occurrence of surface defects such as scratches.

Further, when the secondary particle size of the polishing particle is less than 80 nm, the polishing rate may be slow, and when the secondary particle size thereof exceeds 200 nm, polishing defects may occur.

The polishing slurry composition may comprise the polishing agent in an amount of 0.5 to 2 parts by weight, and the polishing additive composition may comprise the polishing agent in an amount of 1 to 3 parts by weight. When the amount of the polishing agent is less than 0.5 parts by weight, the polishing rate of a patterned wafer may be lowered during the polishing process. When the amount of the polishing agent exceeds 2 parts by weight, scratches or defects may occur on the film to be polished.

When the amount of the polishing additive composition is less than 1 part by weight, polishing loss may occur in a field oxide film of the patterned wafer during the polishing process, or the polishing efficiency of the concave portion may be lowered, thus causing a large step. When the amount thereof exceeds 3 parts by weight, scratches may occur during the polishing process, or the overall polishing rate may be lowered.

The polishing slurry composition may further comprise a residual solvent, wherein the solvent may be any solvent as long as it is one used in a slurry composition for a chemical mechanical polishing process. For example, the solvent may be deionized water, but the solvent is not limited thereto.

Further, the present invention provides a method for polishing an insulating film of a semiconductor element comprising polishing the insulating film, which is formed by embedding a conductive pattern formed on a substrate, with the polishing slurry composition, thereby removing a step involved in the insulating film.

First, a first insulating film may be formed by embedding a conductive pattern formed on a semiconductor substrate. Then, a second insulating film may be formed on the first insulating film. The first insulating film and the second insulating film may be an interlayer insulating film having an insulating property, and, for example, the first insulating film may be a silicon nitride film, and the second insulating film may be a silicon oxide film. In other words, the insulating film may comprise a convex portion (silicon oxide film) and a concave portion (silicon nitride film) formed on the wafer.

The insulating layer may be deposited using plasma enhanced chemical vapor deposition (PECVD) or high density plasma chemical vapor deposition (HDP CVD). Here, the insulating layer may be formed by repeating processes of deposition/etching/deposition, or deposition/etching/deposition/etching. When the insulating layer is formed by repeating the deposition and etching as described above, a conductive pattern formed at the bottom of the film may be affected, causing a step.

In the process for forming an insulating film described above, a step (difference in height between the convex portion and the concave portion) occurs. In the case of an interlayer insulating film, it is necessary to quickly remove the occurring step, and it is important to minimize the step for the next deposition. When the chemical mechanical polishing process is performed using the polishing slurry composition of the present invention described above, it is possible to obtain a uniformly planarized film by using the difference in the polishing rates according to the step height (i.e., the convex portion has a fast polishing rate and the concave portion has a very low polishing rate) to remove the step.

Specifically, the method for polishing an insulating film of a semiconductor element may comprise polishing the insulating film by placing a substrate (wafer) on which the insulating film to be subjected to planarization is formed onto a rotating plate, contacting a surface of the insulating film with the polishing pad of a polisher, and rotating the rotating plate and the polishing pad while supplying the polishing slurry composition of the present invention.

Any rotating plate and the polishing pad may be used without limitation, as long as they are used in a polishing apparatus used in a conventional chemical mechanical polishing process.

Here, in the phase of removing the step involved in the insulating film, the polishing loss for the concave portion comprising the insulating film may be 300 Å or less. In particular, when lysine and a dialkyldiallylammonium halide are used as additives in the case of using the polishing slurry composition of the present invention, it is possible to minimize the polishing loss of the concave portion, as described above.

In addition, in removing the step involved in the insulating film, the polishing rate with respect to the convex portion comprising the insulating film may be from 2,000 Å/min to 5,000 Å/min.

Further, according to the method for polishing an insulating film of a semiconductor element of the present invention, when polishing is performed with the above-described slurry composition, the convex portion having a high step has a high polishing rate due to concentrated pressure, and the concave portion having a low step is not polished due to low pressure depending on the difference in pressure applied, and thus it is possible to minimize the step between the convex portion and the concave portion.

Further, in the case of conventional slurry compositions provided with an auto stop function, the recognition rate of the convex portion and the concave portion is low, and thus performance of the auto stop function tends to deteriorate due to early stoppage, even though there is a large step after the polishing process. However, according to the method for polishing an insulating film of a semiconductor element using the polishing slurry composition of the present invention, even when the step involved in the insulating film is 300 Å or less, and particularly 100 Å or less, the step between the convex portion and the concave portion is recognized such that the polishing is properly set to be stopped automatically, thus resulting in achievement of a polishing process having an excellent degree of planarization through minimization of the step.

The method for polishing an insulating film of the semiconductor element may be used in a chemical mechanical polishing (CMP) process to planarize the insulating film between metal wiring layers, or to perform a planarization process of a semiconductor element such as a flash memory device, or the like.

EXAMPLE

Example 1

Cerium nitrate was dissolved in deionized water, and ammonia water was added thereto until the pH reached 10 to prepare a ceria slurry in an amount of 2% by weight.

Next, a polishing slurry composition was prepared by first preparing a polishing additive composition comprising 0.1 parts by weight of lysine (CAS No. 657-27-2), 0.2 parts by weight of diallyldimethylammonium chloride (CAS No. 7398-69-8), 0.01 parts by weight of PEG #200 (CAS No. 25322-69-3), and triethanolamine (CAS No. 102-71-6) as a pH adjuster, and then adding the above-prepared ceria slurry thereto to complete preparation of the polishing slurry composition.

Example 2

A polishing slurry composition was prepared in the same manner as in Example 1, except that 0.1 parts by weight of arginine (CAS No. 7200-25-1) was used instead of 0.1 parts by weight of lysine (CAS No. 657-27-2).

Example 3

A polishing slurry composition was prepared in the same manner as in Example 1, except that 0.1 parts by weight of histidine (CAS No. 71-00-1) was used instead of 0.1 parts by weight of lysine (CAS No. 657-27-2).

Comparative Example 1

A polishing slurry composition was prepared by blending a calcination ceria slurry CST-S22 polishing slurry prepared by Soulbrain Co., Ltd., ultrapure water, and HAS-A prepared by Soulbrain Co., Ltd., at a ratio of 1:3:2.5.

Comparative Example 2

A polishing slurry composition was prepared in the same manner as in Example 1, except that 0.1 parts by weight of aspartic acid was used instead of 0.1 parts by weight of lysine.

Comparative Example 3

A polishing slurry composition was prepared in the same manner as in Example 1, except that 0.1 parts by weight of cysteine was used instead of 0.1 parts by weight of lysine.

Comparative Example 4

A polishing slurry composition was prepared in the same manner as in Example 1, except that 0.1 parts by weight of serine was used instead of 0.1 parts by weight of lysine.

Comparative Example 5

A polishing slurry composition was prepared in the same manner as in Example 1, except that instead of 0.1 parts by weight of lysine and 0.2 parts by weight of diallyldimethylammonium chloride, only 0.1 parts by weight of lysine was used.

Comparative Example 6

A polishing slurry composition was prepared in the same manner as in Comparative Example 5, except that 0.1 parts by weight of aspartic acid was used instead of 0.1 parts by weight of lysine.

Comparative Example 7

A polishing slurry composition was prepared in the same manner as in Comparative Example 5, except that 0.1 parts by weight of cysteine was used instead of 0.1 parts by weight of lysine.

Comparative Example 8

A polishing slurry composition was prepared in the same manner as in Comparative Example 5, except that 0.1 parts by weight of serine was used instead of 0.1 parts by weight of lysine.

Comparative Example 9

A polishing slurry composition was prepared in the same manner as in Comparative Example 5, except that 0.1 parts by weight of arginine was used instead of 0.1 parts by weight of lysine.

Comparative Example 10

A polishing slurry composition was prepared in the same manner as in Comparative Example 5, except that 0.1 parts by weight of histidine was used instead of 0.1 parts by weight of lysine.

Comparative Example 11

A polishing slurry composition was prepared in the same manner as in Example 1 except that instead of 0.1 parts by weight of lysine and 0.2 parts by weight of diallyldimethylammonium chloride, only 0.2 parts by weight of diallyldimethylammonium chloride was used.

Comparative Example 12

A polishing slurry composition was prepared in the same manner as in Comparative Example 11, except that 0.2 parts by weight of cetylmethylammonium chloride (CAS NO. 112-02-07) was used instead of 0.2 parts by weight of diallyldimethylammonium chloride.

Comparative Example 13

A polishing slurry composition was prepared in the same manner as in Comparative Example 11, except that 0.2 parts by weight of tetramethylammonium chloride (CAS NO. 75-75-0) was used instead of 0.2 parts by weight of diallyldimethylammonium chloride.

Comparative Example 14

A polishing slurry composition was prepared in the same manner as in Comparative Example 11, except that 0.2 parts by weight of tetraethylammonium chloride (CAS NO. 56-34-8) was used instead of 0.2 parts by weight of diallyldimethylammonium chloride.

Comparative Example 15

A polishing slurry composition was prepared in the same manner as in Comparative Example 11, except that 0.2 parts by weight of [2-(methacryloyloxy)ethyl]trimethylammonium chloride (CAS NO. 5039-78-1) was used instead of 0.2 parts by weight of diallyldimethylammonium chloride.

Comparative Example 16

A polishing slurry composition was prepared in the same manner as in Comparative Example 11, except that 0.2 parts by weight of poly(diallyldimethyl)ammonium chloride (CAS NO. 26062-79-3) was used instead of 0.2 parts by weight of diallyldimethylammonium chloride.

Comparative Example 17

A polishing slurry composition was prepared in the same manner as in Example 1, except that 0.2 parts by weight of cetylmethylammonium chloride (CAS NO. 112-02-07) was used instead of 0.2 parts by weight of diallyldimethylammonium chloride.

Comparative Example 18

A polishing slurry composition was prepared in the same manner as in Example 1, except that 0.2 parts by weight of tetramethylammonium chloride (CAS NO. 75-75-0) was used instead of 0.2 parts by weight of diallyldimethylammonium chloride.

Comparative Example 19

A polishing slurry composition was prepared in the same manner as in Example 1, except that 0.2 parts by weight of tetraethylammonium chloride (CAS NO. 56-34-8) was used instead of 0.2 parts by weight of diallyldimethylammonium chloride.

Comparative Example 20

A polishing slurry composition was prepared in the same manner as in Example 1, except that 0.2 parts by weight of [2-(methacryloyloxy)ethyl]trimethylammonium chloride (CAS NO. 5039-78-1) was used instead of 0.2 parts by weight of diallyldimethylammonium chloride.

Comparative Example 21

A polishing slurry composition was prepared in the same manner as in Example 1, except that 0.2 parts by weight of poly(diallyldimethyl)ammonium chloride (CAS NO. 26062-79-3) was used instead of 0.2 parts by weight of diallyldimethylammonium chloride.

Experimental Example

A polishing test was performed by using an SKW 7-2 product having a size of 4 cm×4 cm as a wafer to be polished, a Poli 400 (manufactured by G&P Technology) as a polishing machine, and an IC1010 (manufactured by DOW Chemical Company) as a polishing pad at a polishing pressure of 4 psi and a slurry feed rate of 100 ml/min. Results obtained by measuring the polishing rate of the convex portion, the step (difference between the convex portion and a concave portion), and the polishing loss of the concave portion with an ST-3000 manufactured by K-mac Co., Ltd., are shown in Table 1 below.

TABLE 1

| | Additives | | Polishing Rate of Convex | Just Step | Polishing Loss of Concave |
|---|---|---|---|---|---|
| | Amino Acid | Ammonium Chloride | Portion (Å/min) | Height (Å) | Portion (Å) |
| Example 1 | Lysine | Diallyldimethylammonium Chloride | 2934 | 56 | 178 |
| Example 2 | Arginine | Diallyldimethylammonium Chloride | 2798 | 76 | 211 |
| Example 3 | Histidine | Diallyldimethylammonium Chloride | 2822 | 67 | 193 |
| Comparative Example 1 | — | — | 7486 | 75 | 1812 |
| Comparative Example 2 | Aspartic Acid | Diallyldimethylammonium Chloride | 2097 | 563 | 291 |
| Comparative Example 3 | Cysteine | Diallyldimethylammonium Chloride | 677 | 325 | 153 |
| Comparative Example 4 | Serine | Diallyldimethylammonium Chloride | 2066 | 667 | 788 |
| Comparative Example 5 | Lysine | — | 5897 | 357 | 311 |
| Comparative Example 6 | Aspartic Acid | — | 2420 | 914 | 692 |
| Comparative Example 7 | Cysteine | — | 1123 | 422 | 244 |
| Comparative Example 8 | Serine | — | 4992 | 971 | 1125 |
| Comparative Example 9 | Arginine | — | 5562 | 322 | 3351 |
| Comparative Example 10 | Histidine | — | 5669 | 297 | 367 |
| Comparative Example 11 | — | Diallyldimethylammonium Chloride | 3058 | 606 | 324 |
| Comparative Example 12 | — | Cetylmethylammonium Chloride | 2988 | 325 | 355 |
| Comparative Example 13 | — | Tetramethylammonium Chloride | 2921 | 572 | 923 |
| Comparative Example 14 | — | Tetraethylammonium Chloride | 2335 | 674 | 833 |
| Comparative Example 15 | — | [2-(methacryloyloxy)ethyl]tri-methylammonium chloride | 2559 | 552 | 887 |
| Comparative Example 16 | — | poly(diallyldimethyl)ammonium chloride | 61 | — | — |

TABLE 1-continued

| | Additives | | Polishing Rate of Convex | Just Step | Polishing Loss of Concave |
|---|---|---|---|---|---|
| | Amino Acid | Ammonium Chloride | Portion (Å/min) | Height (Å) | Portion (Å) |
| Comparative Example 17 | Lysine | Cetylmethylammonium Chloride | 2544 | 224 | 311 |
| Comparative Example 18 | Lysine | Tetramethylammonium Chloride | 2359 | 422 | 881 |
| Comparative Example 19 | Lysine | Tetraethylammonium Chloride | 1852 | 302 | 442 |
| Comparative Example 20 | Lysine | [2-(methacryloyloxy)ethyl]trimethyl ammonium chloride | 1755 | 442 | 766 |
| Comparative Example 21 | Lysine | poly(diallyldimethyl)ammonium chloride | Evaluation cannot be performed due to low polishing rate | | |

As can be seen from the Examples and Comparative Examples, the polishing slurry composition of the present invention includes a basic amino acid (lysine, arginine, or histidine) and dialkyldiallylammonium chloride as additives, thereby resulting in improvement of the polishing rate of the convex portion while minimizing the polishing loss of the concave portion in a chemical mechanical polishing process using the polishing slurry composition, and thus the step of the patterns can be minimized. Further, the auto stop function can be performed at a very small planarization point (for a step of 300 Å or less), and thus the polishing can be automatically stopped at a point when the step is minimized while minimizing the polishing loss of the concave portion.

The polishing additive composition of the present invention may reduce the polishing loss of the concave portion of the pattern in the chemical mechanical polishing process, among the processes for manufacturing a semiconductor element, to minimize the step of the convex portion and the concave portion and to increase the polishing efficiency with respect to the convex portion of the pattern, thereby resulting in improvement of the polishing rate with respect to the convex portion and shortening of the polishing time.

Further, since the polishing slurry composition of the present invention has an automatic polishing stop (auto stop) function with a very high recognition rate for the convex portion and the concave portion, when the polishing slurry composition is used to perform the chemical mechanical polishing, the polishing is not further advanced at a specific planarization point (at a step of 300 Å or less), and thus the step between the convex portion and the concave portion can be minimized.

What is claimed is:

1. A polishing additive composition comprising:
a dialkyldiallylammonium halide,
a basic amino acid,
a non-ionic surfactant, and
a pH adjuster,
wherein the dialkyldiallylammonium halide comprises at least one selected from a group consisting of diethyldiallylammonium halide, dipropyldiallylammonium halide, dibutyldiallylammonium halide, and diisopropyldiallylammonium halide,
wherein the non-ionic surfactant comprises polyethylene glycol (PEG), and
wherein the pH adjuster comprises triethanolamine,
wherein pH of the composition is 5 to 7.

2. The polishing additive composition of claim 1, wherein the alkyl of the dialkyldiallylammonium halide comprises a linear or branched alkyl group having 1 to 10 carbon atoms.

3. The polishing additive composition of claim 1, wherein the basic amino acid comprised at least one selected from a group consisting of lysine, arginine, and histidine.

4. The polishing additive composition of claim 1, wherein the dialkyldiallylammonium halide is included in an amount of 0.01 to 2 parts by weight, the basic amino acid is included in the polishing additive composition in an amount of 0.01 to 2 parts by weight, and the non-ionic surfactant is included in an amount of 0.01 to 2 parts by weight.

5. A polishing slurry composition comprising:
a polishing agent including polishing particles; and
the polishing additive composition of claim 1,
wherein the polishing particles is included in an amount of 0.1 to 5 wt %, and the primary particle size is 10 to 80 nm, the second particle size is 80 to 200 nm;
the polishing particles in the polishing agent is included in an amount of 0.1 to 5 wt %.

6. The polishing slurry composition of claim 5, wherein a surface of the polishing particles is positively charged (+).

7. The polishing slurry composition of claim 6, wherein the zeta potential of the surface of the polishing particles is +30 mV to +60 mV.

8. The polishing slurry composition of claim 5, wherein the polishing particles are particles comprising a metal oxide.

9. The polishing slurry composition of claim 5, wherein the polishing particles comprise at least one metal oxide selected from the group consisting of zirconia, alumina, silica, and ceria.

10. The polishing slurry composition of claim 5, wherein the polishing slurry composition comprises the polishing agent in an amount of 0.5 to 2 parts by weight, and the polishing additive composition in an amount of 1 to 3 parts by weight.

11. A method for polishing an insulating film of a semiconductor element, comprising:
polishing an insulating film, which is formed by embedding a conductive pattern formed on a substrate, with the polishing slurry composition of claim 5, thereby removing a step involved in the insulating film.

12. The method of claim 11, wherein the method comprises polishing the insulating film by placing a substrate on which an insulating film is formed onto a rotating plate, contacting a surface of the insulating film with a polishing pad of a polisher, and rotating the rotating plate and the polishing pad while supplying the polishing slurry composition.

13. The method of claim 11, wherein in the phase of removing the step involved in the insulating film, the polishing loss for the concave portion included in the insulating film is 300 Å or less.

14. The method of claim 11, wherein the method comprises an automatic polishing stop (auto stop) in which the polishing is automatically stopped when the step involved in the polishing film is 300 Å or less at the time of polishing with the polishing slurry composition.

15. A semiconductor element formed by the method for polishing an insulating film of a semiconductor element of claim 11.

* * * * *